United States Patent
Liu et al.

(10) Patent No.: US 9,318,412 B2
(45) Date of Patent: Apr. 19, 2016

(54) METHOD FOR SEMICONDUCTOR SELF-ALIGNED PATTERNING

(71) Applicant: NANYA TECHNOLOGY CORPORATION, Tao-Yuan Hsien (TW)

(72) Inventors: An Hsiung Liu, Taoyuan County (TW); Ya Chih Wang, New Taipei (TW)

(73) Assignee: NANYA TECHNOLOGY CORPORATION, Tao-Yuan (TW)

( * ) Notice: Subject to any disclaimer, the term of this patent is extended or adjusted under 35 U.S.C. 154(b) by 0 days.

(21) Appl. No.: 13/951,717

(22) Filed: Jul. 26, 2013

(65) Prior Publication Data

US 2015/0028459 A1    Jan. 29, 2015

(51) Int. Cl.
*H01L 23/58* (2006.01)
*H01L 23/48* (2006.01)
*H01L 21/033* (2006.01)

(52) U.S. Cl.
CPC ............ *H01L 23/48* (2013.01); *H01L 21/0337* (2013.01); *H01L 2924/0002* (2013.01)

(58) Field of Classification Search
CPC ....................................................... H01L 23/48
USPC ......................................................... 257/640
See application file for complete search history.

(56) References Cited

U.S. PATENT DOCUMENTS

| | | | |
|---|---|---|---|
| 2002/0121502 A1* | 9/2002 | Patel et al. | 216/73 |
| 2003/0073276 A1* | 4/2003 | Lin et al. | 438/201 |
| 2006/0240361 A1 | 10/2006 | Lee et al. | |
| 2006/0273456 A1 | 12/2006 | Sant et al. | |
| 2010/0028809 A1 | 2/2010 | Vanleenhove et al. | |
| 2010/0105213 A1* | 4/2010 | Ishikawa et al. | 438/717 |
| 2010/0170868 A1 | 7/2010 | Lin et al. | |
| 2010/0258913 A1* | 10/2010 | Lue | 257/618 |
| 2010/0330498 A1 | 12/2010 | Bae et al. | |

OTHER PUBLICATIONS

Office Action and Search report dated Nov. 2, 2015 from the Taiwan Intellectual Property Office for counterpart Taiwan application 103110615.
English abstract translation of the office action dated Nov. 2, 2015 from the Taiwan Intellectual Property Office for counterpart Taiwan application 103110615.

* cited by examiner

*Primary Examiner* — Ajay K Arora
(74) *Attorney, Agent, or Firm* — WPAT, P.C.; Anthony King

(57) ABSTRACT

A method for semiconductor self-aligned patterning includes steps of providing a substrate comprising a first layer and a second layer, wherein the first layer is on top of the second layer; removing a portion of the first layer to form a first pattern; depositing a first conformal layer on the first pattern; depositing a second conformal layer on the first conformal layer; removing a portion of the second conformal layer to expose a portion of the first conformal layer; and thinning the first conformal layer and the second conformal layer alternatively to form a second pattern. A semiconductor self-aligned structure is also provided.

10 Claims, 11 Drawing Sheets

METHOD FOR SEMICONDUCTOR SELF-ALIGNED PATTERNING

TECHNICAL FIELD

The present invention relates in general to a method for semiconductor self-aligned patterning and more particularly to a method for a semiconductor self-aligned multiple patterning method used to generate sub 20 nm features.

DISCUSSION OF THE BACKGROUND

The DRAM half pitch is predicted to become less than 20 nm if the technology follows the scaling trend according to the ITRS road map reports. As a consequence, providing a patterned semiconductor chip with a minimal feature size below 20 nm is a matter of great importance in field of lithography. Extreme Ultraviolet lithography (EUV) with a wavelength of 13.5-14 nm had been proposed as one option for reaching the 10 nm technology node. However, the generation of the EUV source involves plasma reaction and extreme vacuum that are both high in cost and not production ready. EUV light source intensity is currently at least one or two orders of magnitude lower than the conventional lithography light intensity. In addition, moving to EUV means the challenge of using reflective masks and researching a completely different etching chemistry. In order to overcome the weak EUV power problem, improvements on the sensitivity of the resist had been raised. Nevertheless, a highly sensitive resist generates shot noise that results in significant sidewall roughness.

Maskless, massively parallel electron beam lithography (EBL) is an EUV alternative and another way to advance to the next technology node. The many variants of EBL essentially eliminate the mask and use tens or hundreds of thousands of electron beams to do the etching. Compared to EUV, EBL is a straightforward alternative but has been hindered by low throughput. Thus, the massively parallelizing EBL still requires more improvements before the process can become profitable.

Without the help of EUV and EBL, other approaches such as using a special material and photoresist chemical reaction had been demonstrated to be effective for a sub 20 nm feature formation. The above-mentioned chemical based patterning approach includes treating a hard-baked resist pattern with a material effective enough to make an alkaline surface of the resist pattern; applying a second layer of a second photosensitive composition to be in contact with the alkaline surface of the resist pattern, wherein the second photosensitive composition comprises a second resin component and a photoacid generator; exposing the second layer to activating radiation; and developing the exposed second layer to form spacers over the layers to be patterned, wherein the spacers comprise portions of the second layer not removed during the second layer development.

It is the cross-linked reaction between the alkaline surface and the second layer that contribute to the formation of spacers. The spacers are then used as a soft mask with a smaller feature size, thereby patterning the underlying layers to be patterned. Due to the fact that the occurrence of the chemical reaction is essential to the present procedure, the materials used to form each features is limited to a certain category, mostly soft materials, which is problematic when a higher processing temperature is required.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

The present invention discloses a method for semiconductor self-aligned patterning. One objective of the present invention is to manufacture a semiconductor chip with a minimal feature size below 20 nm. The method provided is free from using EUV, EBL, or any chemical reaction which limits the materials and the processing temperature used during the feature formation.

In one embodiment, the method includes steps of providing a substrate having a first layer and a second layer, wherein the first layer is on top of the second layer; removing a portion of the first layer to form a first pattern; depositing a first conformal layer on the first pattern; depositing a second conformal layer on the first conformal layer; removing a portion of the second conformal layer to expose a portion of the first conformal layer; and thinning the first conformal layer and the second conformal layer alternatively to form a second pattern.

In the same embodiment, the step of thinning the first conformal layer and the second conformal layer alternatively includes thinning the second conformal layer by a first etch, thinning the first conformal layer by a second etch, and thinning the second conformal layer by a third etch.

In the same embodiment, the step of removing a portion of the first layer to form a first pattern includes: providing a plurality of line features on the first layer, wherein each line feature comprises two side walls; forming spacers over the two side walls of each line feature; removing the plurality of line features; and transferring a profile of the spacers to the first layer.

In one embodiment, the line features comprise a line width to line space ratio of 5:7, wherein the line width can be of from 35 nm to 50 nm, and the line space can be from 49 nm to 70 nm. In another embodiment, the second pattern has a minimal feature size of from 7 nm to 10 nm.

In one embodiment, the material of the spacers and the material of the first conformal layer are identical, and the material of the first conformal layer and the material of the second conformal layer are different. In another embodiment, the etching selectivity of the first conformal layer and the second conformal layer is greater than 10.

In another embodiment, a semiconductor self-aligned structure is provided. Said semiconductor self-aligned structure comprises a carrier; a first pattern with a first feature size that is positioned on the carrier; and a second pattern with a second feature size that is positioned on the carrier. Wherein the first feature size is a space between adjacent first features, and the second feature size is a space between adjacent second features. Materials composing a first portion of the second pattern are different from materials composing a second portion of the second pattern The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention are illustrated with the following description and upon reference to the accompanying drawings in which.

DETAILED DESCRIPTION

Figure 1:
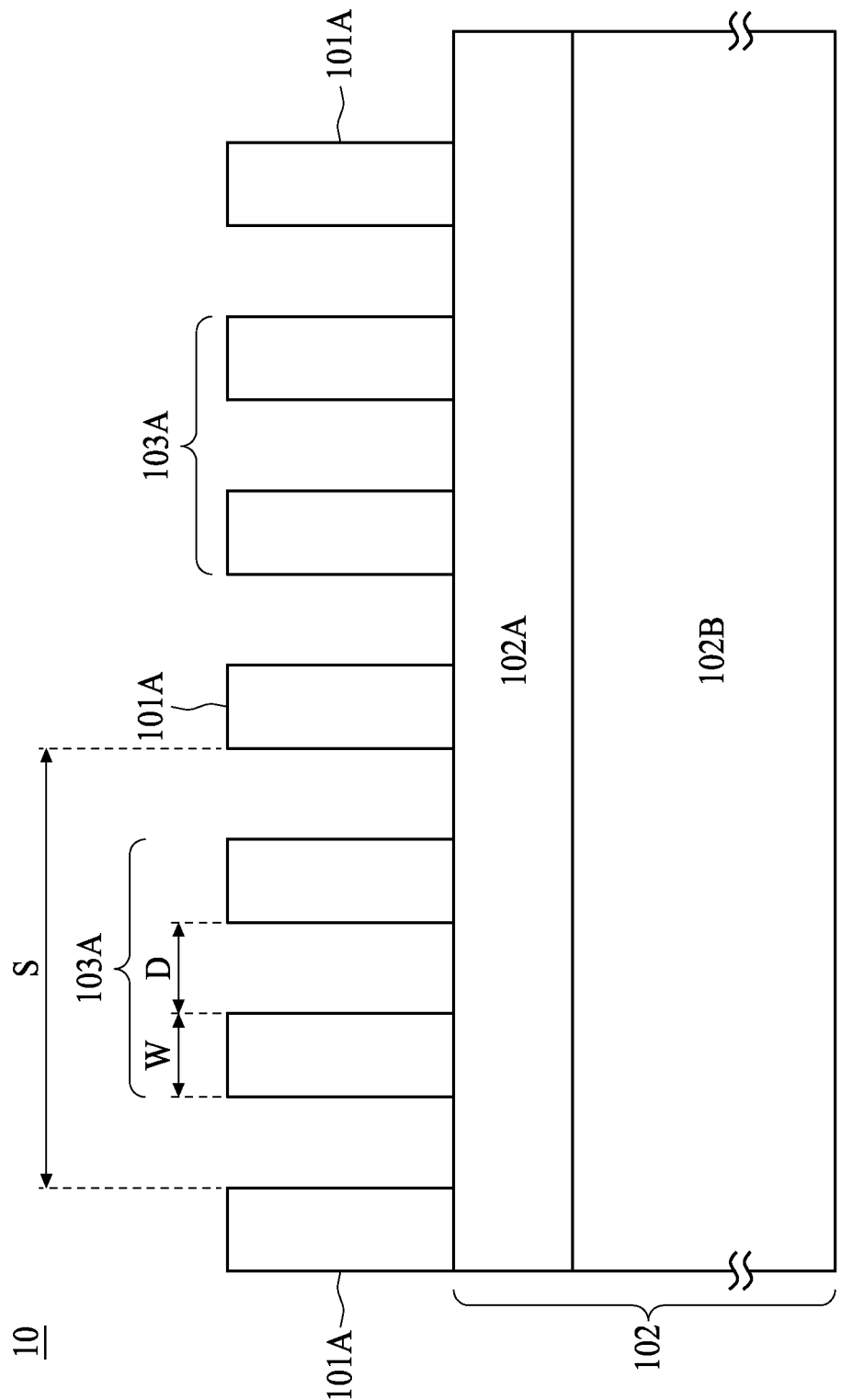
FIG. 1 illustrates a cross-sectional view of a self-aligned patterning structure according to one embodiment of the present invention.

FIG. 1 illustrates a cross-sectional view of a self-aligned patterning structure 10 according to one embodiment of the present invention. The structure 10, prepared by the manufacturing processes disclosed in the present invention, includes a first pattern 101A and a second pattern 103A, in which both are positioned on a second layer 102. In other embodiments, the second layer 102 can be a carrier composed of materials such as a semiconductor wafer or an insulating layer. In the present embodiment where the first pattern 101A and the second pattern 103A are both positioned on a second layer 102, the second layer 102 can further include an anti-reflection layer 102A and a carbon-based layer 102B. The anti-reflection layer 102A is a layer of deep ultraviolet anti-reflection coating (DARC), and the carbon-based layer 102B is an amorphous carbon layer. The first pattern 101A is formed by removing a portion of a first layer (not shown), and the second pattern is composed of at least two segments of different materials. In FIG. 1, the minimal feature size D of the second pattern 103A is smaller than the minimal feature size S of the first pattern 101A. In one embodiment, the minimal feature size D of the second pattern 103A is smaller than 20 nm, and preferably smaller than 10 nm.

Figure 2:
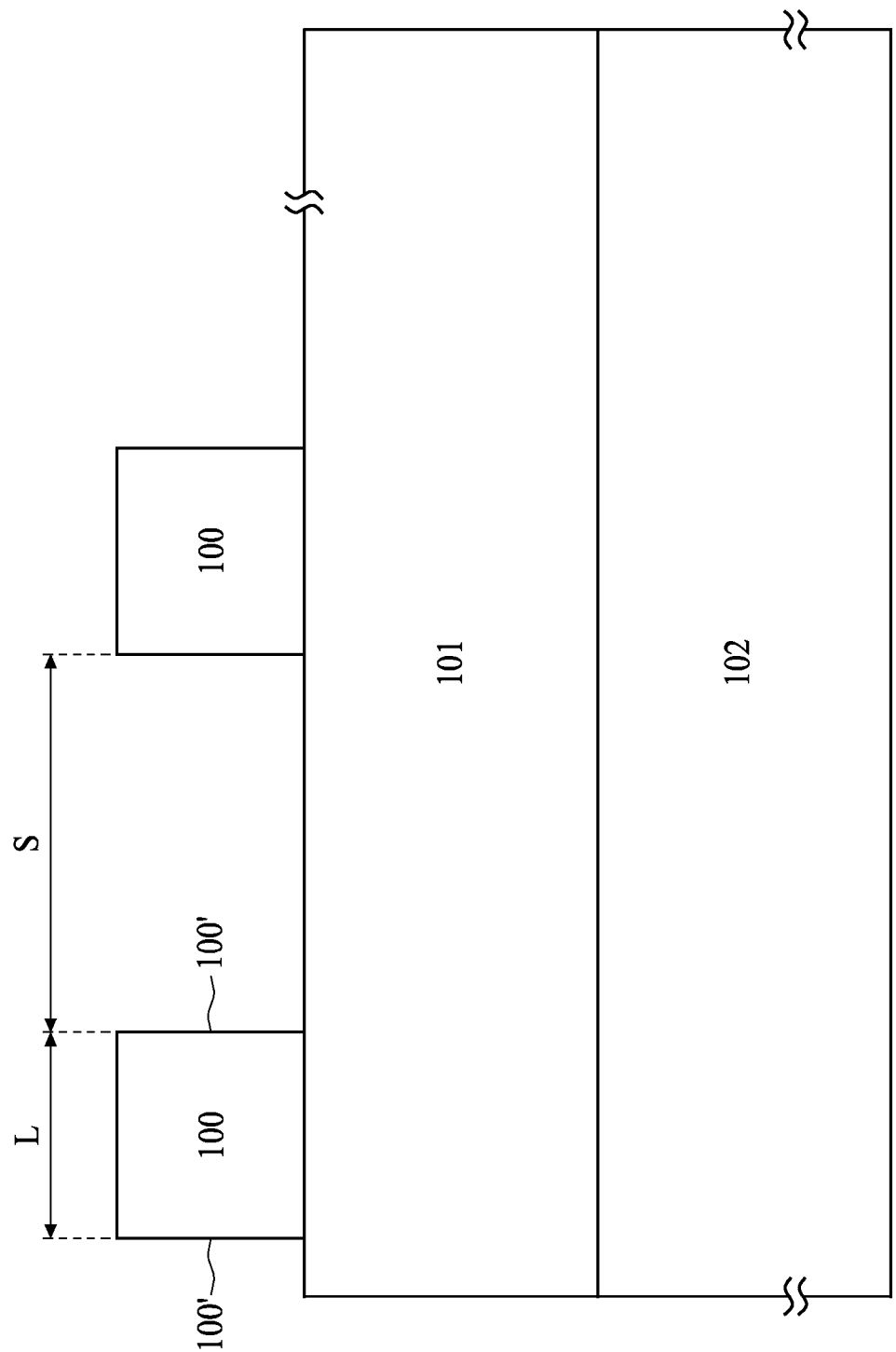
FIG. 2 to FIG. 11 depict a cross-sectional view of manufacturing steps with respect to forming a self-aligned patterning structure according to one embodiment of the present invention.

FIG. 2 to FIG. 11 depict manufacturing steps of forming a self-aligned patterning structure according to one embodiment of the present invention. In FIG. 2, a substrate includes a first layer 101 and a second layer 102. The first layer 101 is preferably positioned on top of the second layer 102, and the material composing the first layer 101 is different from that composing the second layer 102. A plurality of line features 100 are arranged equidistant on the first layer 101. In the present embodiment, each line feature 100 can be characterized by a line width L and a line space S, wherein the line width L is literally the width of the line feature 100, and the line space S is the distance between two adjacent line features 100. The line feature 100 can be a patterned photoresist in one of the embodiment.

Figure 3:
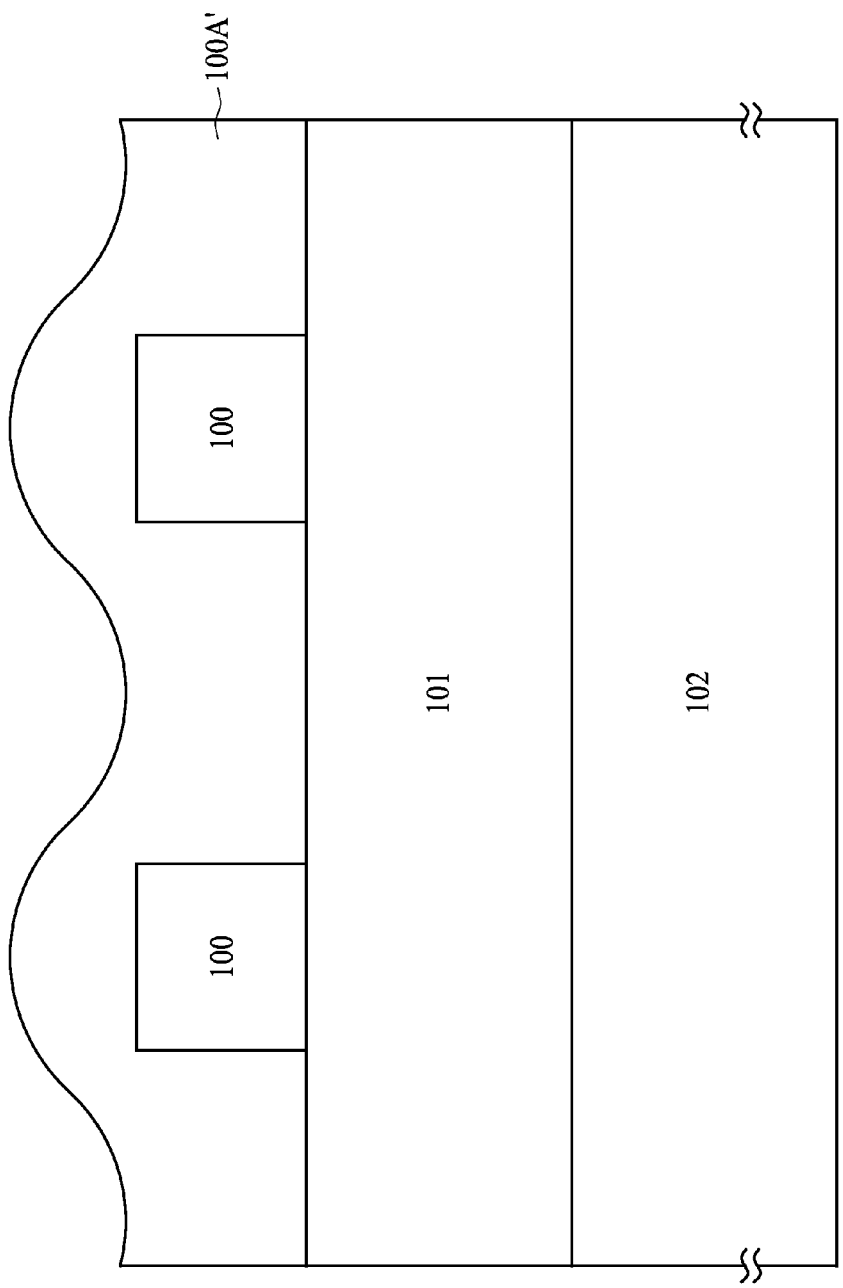
Figure 4:
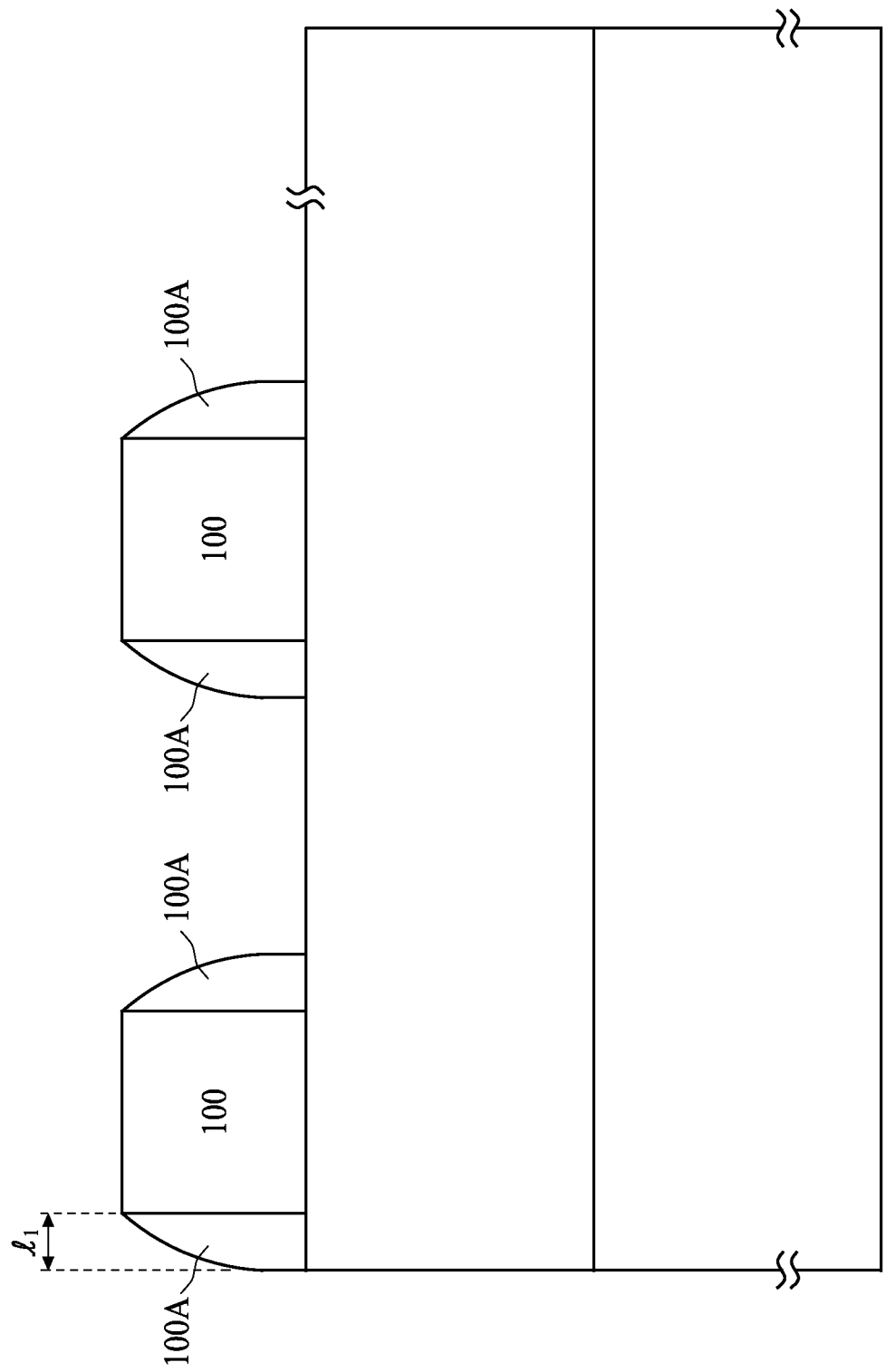

Referring to FIG. 2, FIG. 3, and FIG. 4, each line feature 100 has two sidewalls 100' over which the a spacer 100A having a thickness of $l_1$ is formed. The detail of the spacer 100A formation is shown in FIG. 3. A spacer layer 100A' is deposited over the line features 100, for example, by an atomic layer deposition, sputtering, or a chemical vapor deposition such as plasma-enhanced CVD, low-pressure CVD or epitaxial growth. Of these, chemical vapor deposition is preferred. Suitable materials for the spacer layer include, for example, silicon oxide, silicon nitride or silicon oxynitride.

Because the spacer layer 100A' is typically coated over the entire surface of the first layer 101, etching is conducted to remove the spacer layer material 100A' on horizontal surfaces of the first layer 101, leaving material as spacers 100A on sidewalls of the line features 100. Preferably, the etching is conducted to remove a portion of the spacer layer 100A' until the top surface of the line feature 100 and the top surface of the first layer 101 are exposed.

Figure 5:
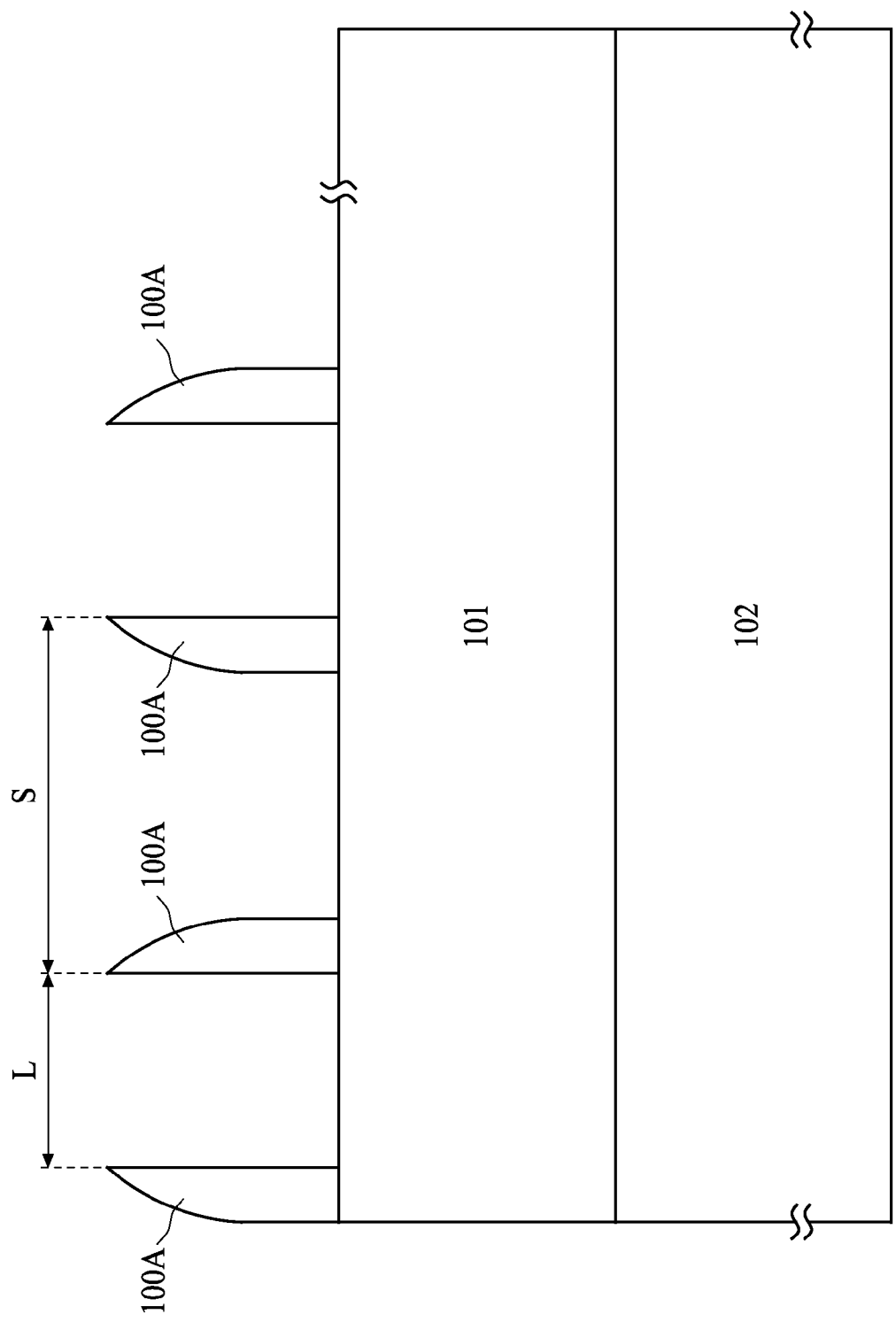

In FIG. 5, the line feature 100 is removed by a photoresist strip process in one embodiment. The spacers 100A remain after the photoresist stripping process, and hence an array of spacers is formed. The distance between the two spacers from the left is L, and the distance between the second and the third spacers from the left is S. Said L and S inherit the dimensions determined in the step of line feature formation as shown in FIG. 2.

Figure 6:
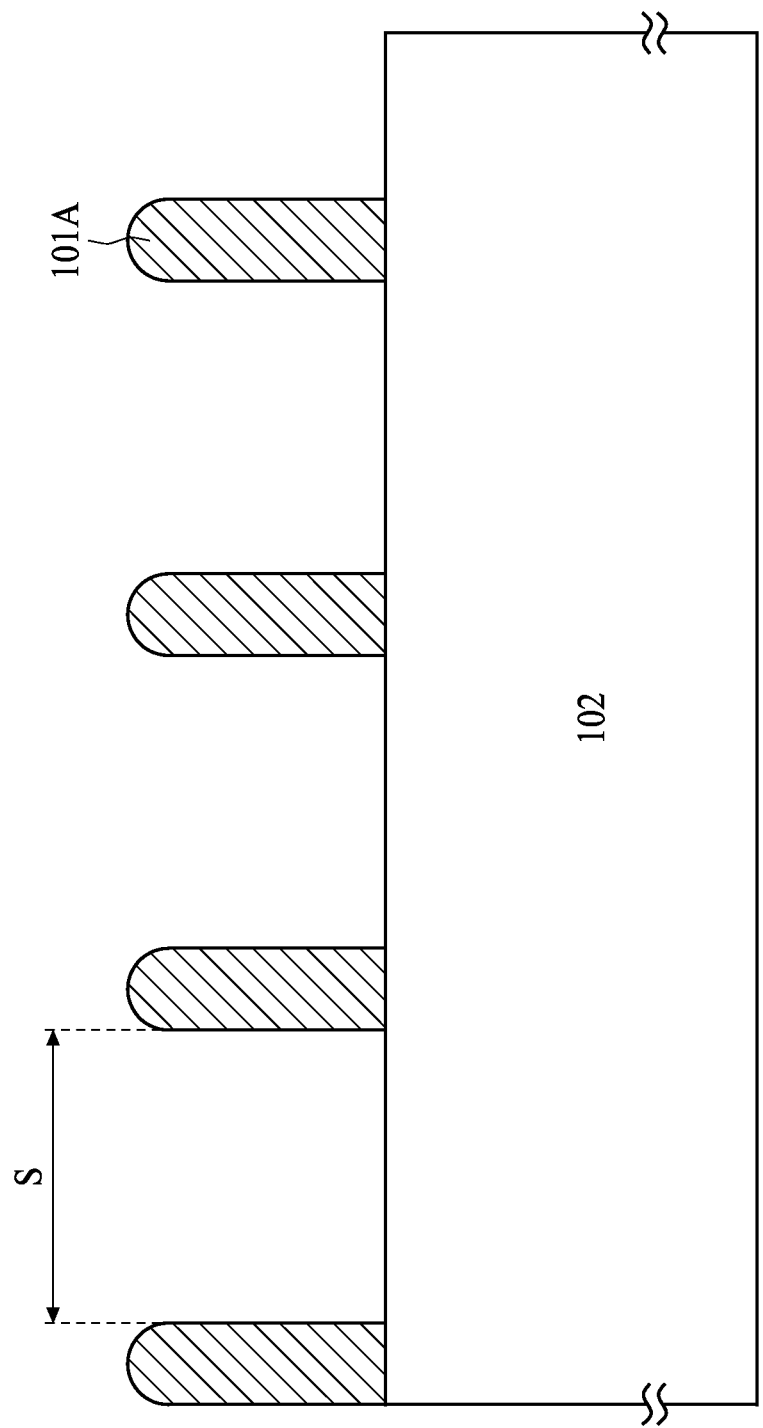

In FIG. 6, an anisotropic plasma etch, preferably a reactive ion etch, is carried out to transfer the profile of the spacers 100A of FIG. 5 to the underlying first layer 101. At the completion of this step, a portion of the first layer is removed by the plasma etch process, and the first pattern 101A is formed. In the present embodiment, the minimal feature size of the first pattern 101A is S. The materials of the first layer 101 can be used as a hard mask, which, in turn, can be used as a mask for etching the underlying second layer 102. Typical hard mask materials include, for example, tungsten, titanium, titanium nitride, titanium oxide, zirconium oxide, aluminum oxide, aluminum oxynitride, hafnium oxide, amorphous carbon, silicon oxynitride, polysilicon, and silicon nitride.

Figure 7:
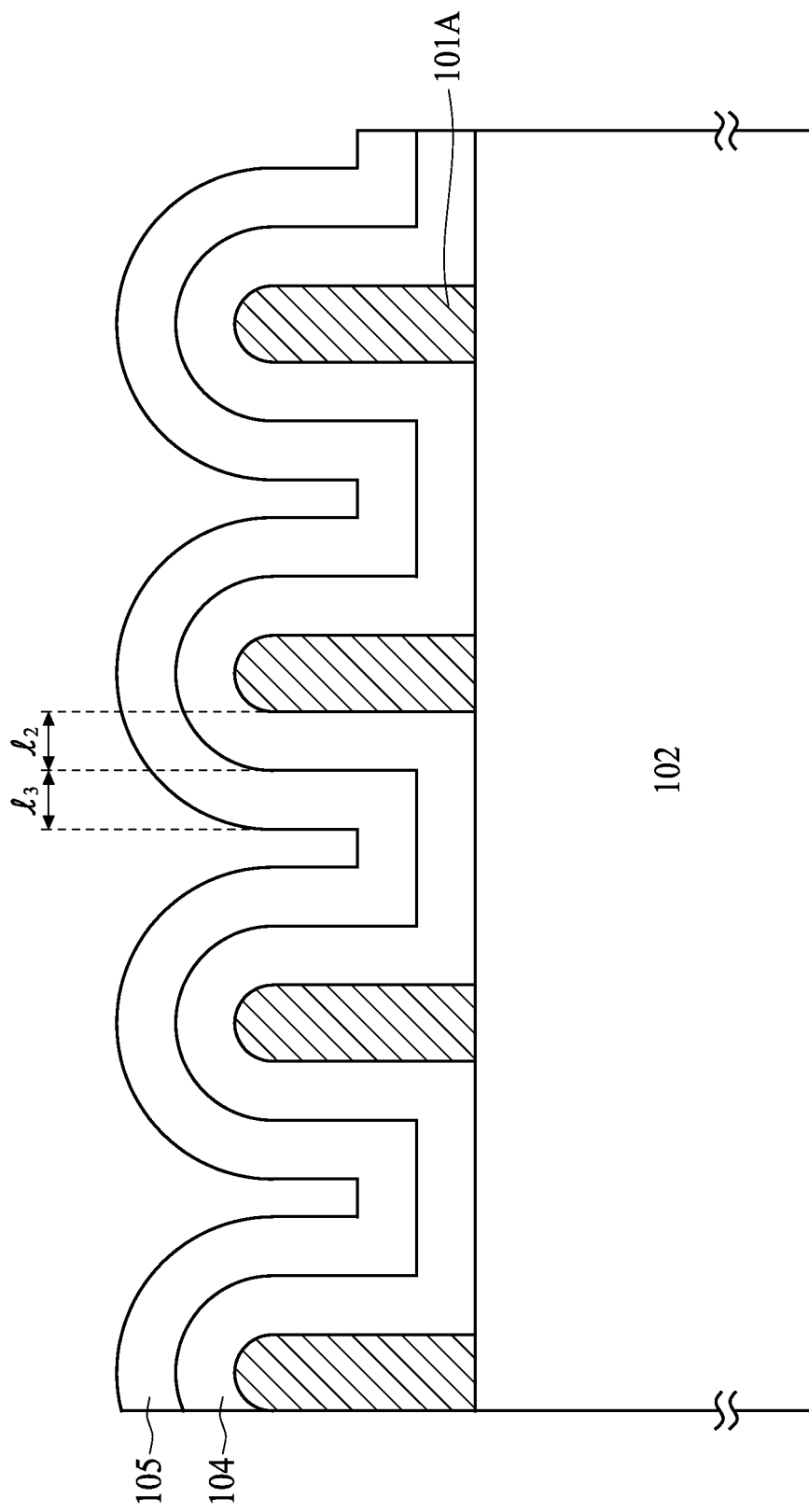

As shown in FIG. 7, the first conformal layer 104 having a thickness $l_2$ and the second conformal layer 105 having a thickness $l_3$ are deposited on the first pattern 101A subsequently. The conformal deposition process can be carried out by a plasma-enhanced chemical vapor deposition. In one embodiment, the thicknesses $l_2$ and $l_3$ are equal. The material of the spacers and the material of the first conformal layer can be silicon nitride, silicon oxide, polysilicon, or the combination thereof. In one embodiment, the material of the spacers and the material of the first conformal layer are identical. Of course, the materials composing the spacers and the first conformal layer can be different. The material of the first conformal layer and the material of the second conformal layer can be silicon nitride, silicon oxide, polysilicon, or the combination thereof. Since the selectivity to the same etchant between the first conformal layer and the second conformal layer shall be sufficiently large in the preset invention, the materials composing the two conformal layers are different. For example, the etching selectivity between the first conformal layer and the second conformal layer is greater than 10, preferably greater than 20, and most preferably greater than 50.

Figure 8:
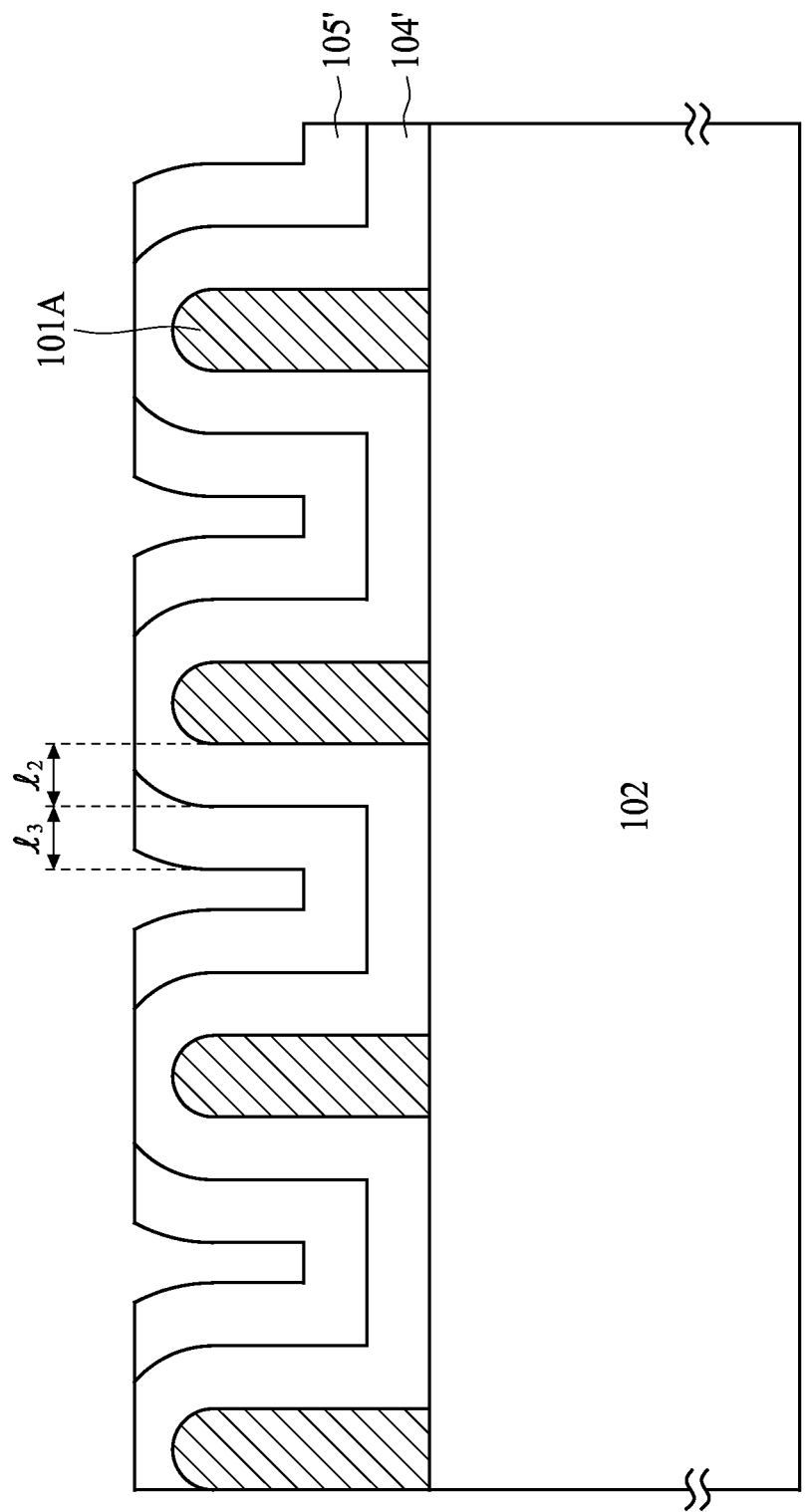

Referring to FIG. 7 and FIG. 8, a portion of the second conformal layer 104 is removed to a point that the first conformal layer 104 is exposed. In one embodiment, a chemical mechanical polishing (CMP) process is carried out to remove the top of the second conformal layer 105 to obtain a second conformal layer 105' after CMP. The first conformal layer 104' after CMP starts to be exposed when a thickness $l_3$ is removed from the top. In the lateral direction, the thickness $l_2$ of the first conformal layer 104' and the thickness $l_3$ of the second conformal layer 105' remain intact and are free from any effect caused by the CMP process. In the following step, the first conformal layer 104' and the second conformal layer 105' are thinned in an alternative manner by a plurality of etching processes to form the second pattern 103A as shown in FIG. 1.

Figure 9:
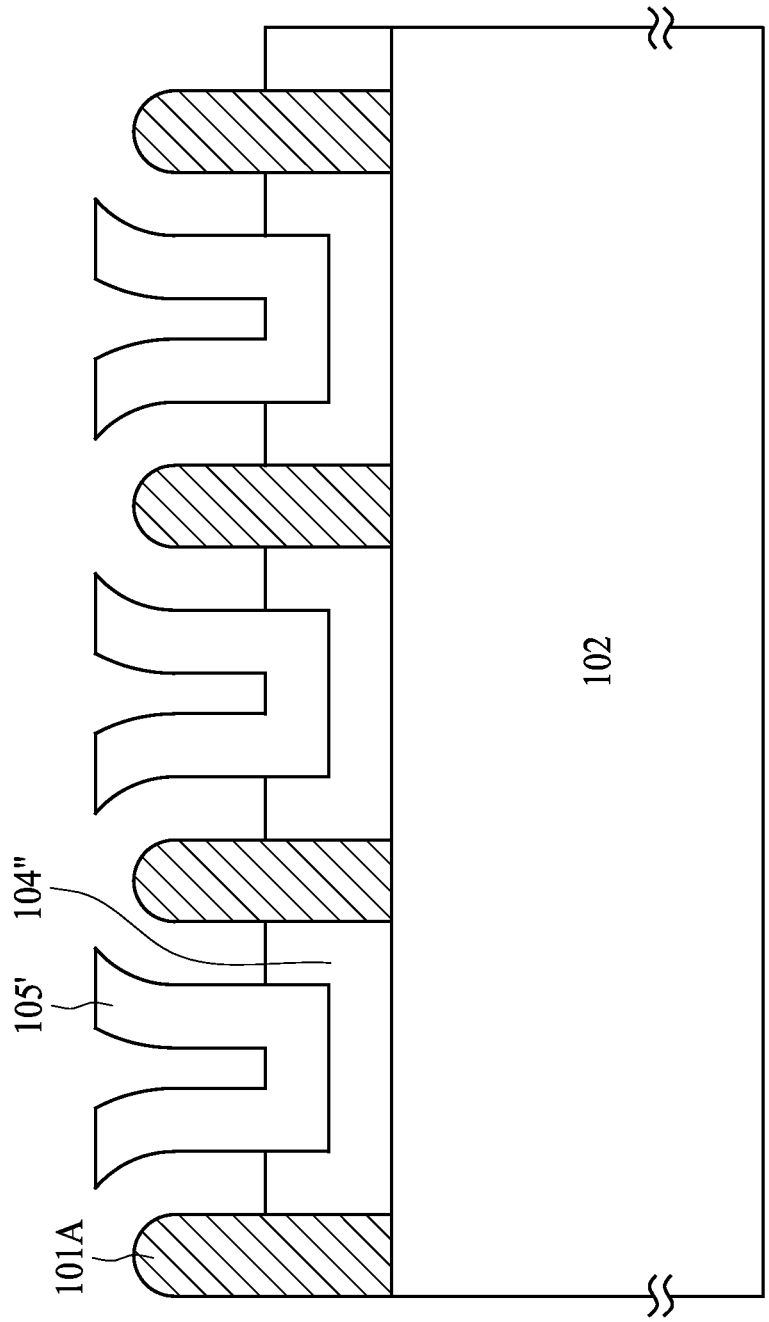

Referring to FIG. 8 and FIG. 9, a first etch is performed to remove the first conformal layer 104' to an extent that the first pattern 101A and the sidewalls of the second conformal layer 105' are exposed. In FIG. 9, the first conformal layer 104" is obtained after the first etch, preferably by an anisotropic etch technique in the art. Due to the fact that the etching selectivity between the first conformal layer and the second conformal layer is high, the first etch utilizes the chemistry that primarily attacks the materials of the first conformal layer.

Figure 10:
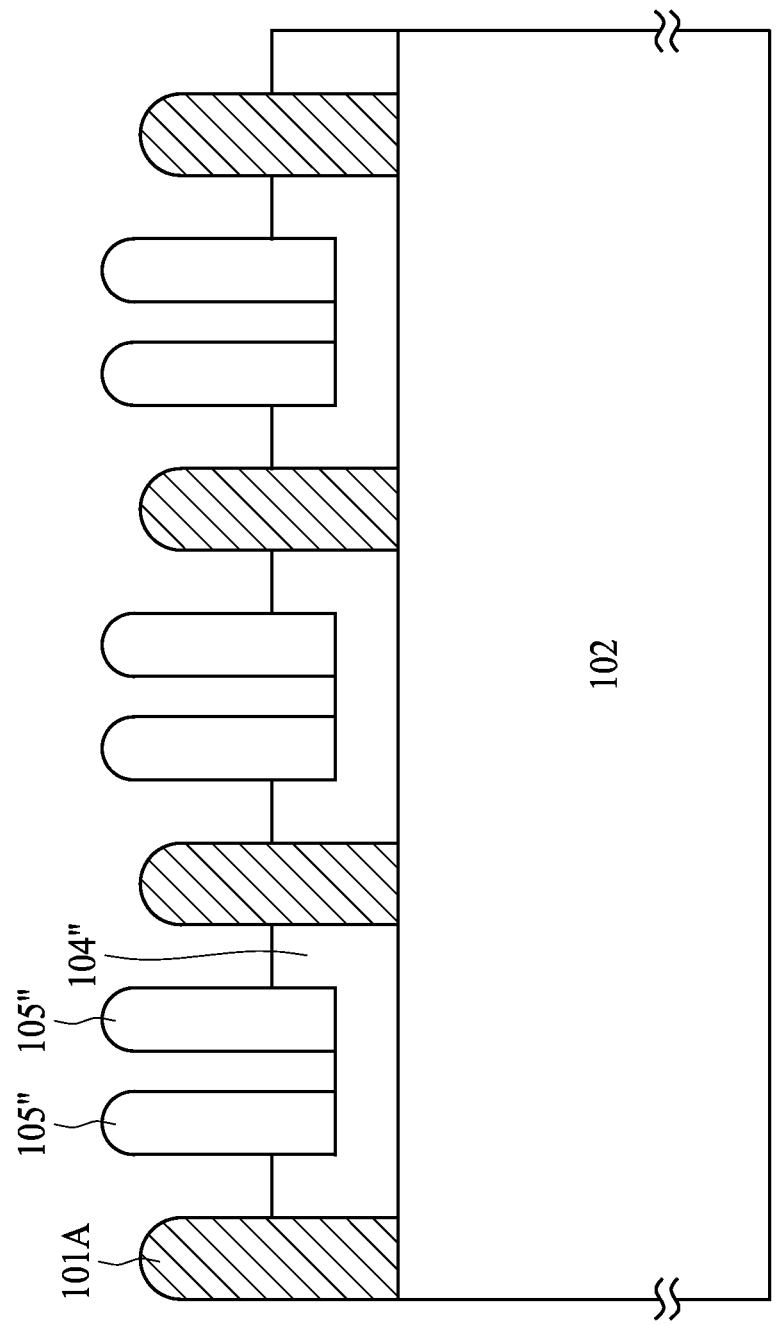

Referring to FIG. 9 and FIG. 10, a second etch is performed to remove the second conformal layer 105' to an extent that the bottom of the second conformal layer 105' is completely removed and the underlying first conformal layer 104" is exposed. In FIG. 10, the second conformal layer 105" is obtained after the second etch, preferably by an anisotropic etch technique in the art. Due to the fact that the etching selectivity between the first conformal layer and the second conformal layer is high, the second etch utilizes the chemistry that primarily attacks the materials of the second conformal layer. As shown in FIG. 10, the height of the second conformal layer 105" is reduced if compared to the second conformal layer 105' shown in FIG. 9. The second etch process is not suitable for an excess overetch because the consumption of the second conformal layer 105" would continue, resulting to a second pattern with insufficient height.

Figure 11:
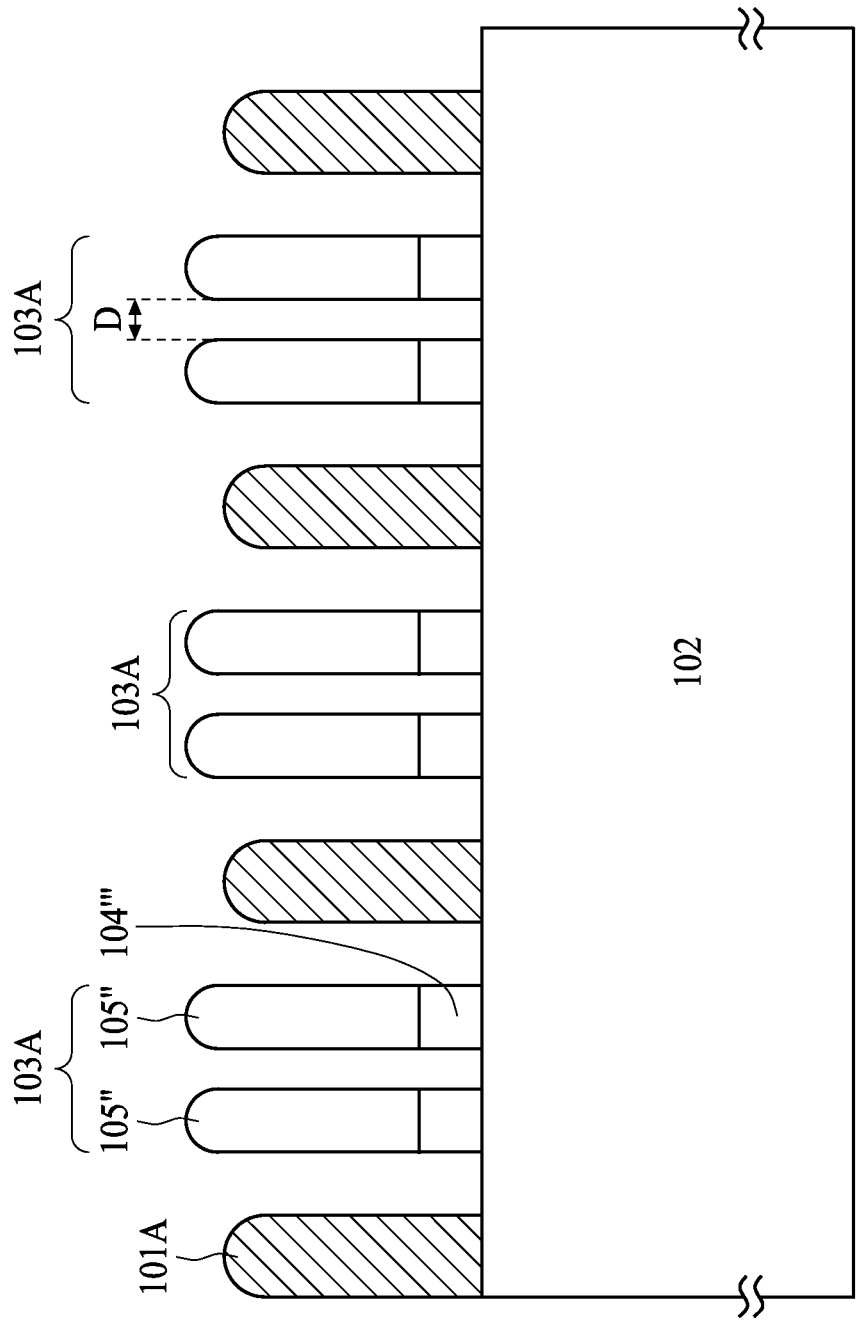

Referring to FIG. 10 and FIG. 11, a third etch is performed to remove the first conformal layer 104" to a point that the portion of the first conformal layer 104" not shadowed by the second conformal layer 105" is completely removed. In FIG. 11, the first conformal layer 104'" is obtained after the third etch, preferably by an anisotropic etch technique in the art, and the second pattern 103A is formed at the completion of the third etch. Using the manufacturing method proposed by the present invention, the resulting second pattern can be characterized by containing a first portion, composed of the first conformal layer 104'", and a second portion, composed of the second conformal layer 105". The distance D between two features of the second pattern is the same as that shown in FIG. 1.

Table 1 demonstrates the dimensions suitable to be used in the present invention. Referring to FIGS. 2 to 4 and Table 1, Embodiment 1 possesses a plurality of line features with a line width L of 50 nm and a line space S of 70 nm, and hence the original pitch dimension is 120 nm. The spacer thickness $l_1$, and the thickness of the first conformal layer and the second conformal layer ($l_2$ and $l_3$) are all 10 nm in the present embodiment, resulting to a self-aligned pattern array having a minimal feature size of 10 nm/10 nm (i.e. distance of W/D) as shown in FIG. 1. The exposure tool utilized in Embodiment 1 is a 193 nm argon fluoride excimer laser under a dry setting. Note that the size of the line features and the spacer thickness decrease in other Embodiments, and the exposure tool used is preferably changed to a 193 nm argon fluoride excimer laser under a wet setting. In Embodiment 4, a self-aligned pattern array having a minimal feature size of 7 nm/7 nm can be obtained using the method disclosed in the present invention.

TABLE 1

| | Spacer Thickness (nm) | Line feature Profile | | Array W/D (nm) | Original Pitch (nm) | Exposure Tool |
|---|---|---|---|---|---|---|
| | | Line (nm) | Space (nm) | | | |
| Embodiment 1 | 10 | 50 | 70 | 10/10 | 120 | ArF-Dry |
| Embodiment 2 | 9 | 45 | 63 | 9/9 | 108 | ArF-Immersion |
| Embodiment 3 | 8 | 40 | 56 | 8/8 | 96 | ArF-Immersion |
| Embodiment 4 | 7 | 35 | 49 | 7/7 | 84 | ArF-Immersion |

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor self-aligned structure, comprising:
a carrier;
a first pattern with a first feature size that is positioned above the carrier, wherein the first feature size is a space between adjacent; first features, wherein the first feature size being smaller than that obtainable by a photoresist pattern printing, and the first pattern is symmetric about a central axis; and
a second pattern with a second feature size that is positioned on the carrier, wherein the second feature size is a space between adjacent second features; and in which materials composing a first portion of the second pattern are different from materials composing a second portion of the second pattern;
wherein the first portion is above the carrier, the second portion is above the first portion such that the first portion is sandwiched between the second portion and the carrier;
wherein width of the first portion is substantially the same as width of the second portion;
wherein width is measured in the same direction as feature size; and
wherein a sidewall of the first portion is not covered by the materials composing the second portion.

2. The semiconductor self-aligned structure of claim 1, wherein the materials composing the first portion and the second portion of the second pattern are etchant-selective.

3. The semiconductor self-aligned structure of claim 2, wherein the etchant selectivity between the materials composing the first portion of the second pattern and the second portion of the second pattern is greater than 10.

4. The semiconductor self-aligned structure of claim 1, wherein the second feature size is equal to or smaller than 10 nm.

5. The semiconductor self-aligned structure of claim 1, wherein the carrier comprises an anti-reflection layer, a carbon-based layer, or the combination thereof.

6. The semiconductor self-aligned structure of claim 1, wherein the materials composing the first patterns are tungsten, titanium, titanium nitride, titanium oxide, zirconium oxide, aluminum oxide, aluminum oxynitride, hafnium oxide, amorphous carbon, silicon oxynitride, polysilicon, silicon nitride, or the combination thereof.

7. The semiconductor self-aligned structure of claim 1, wherein the materials composing the first portion of the second pattern are silicon oxide, silicon nitride, polysilicon, or the combination thereof.

8. The semiconductor self-aligned structure of claim 1, wherein the materials composing the second portion of the second pattern are silicon oxide, silicon nitride, polysilicon, or the combination thereof.

9. The semiconductor self-aligned structure of claim 1, wherein width of the second feature measured in the same direction as feature size and the second feature size are the same.

10. The semiconductor self-aligned structure of claim 9, wherein width of the first feature measured in the same direction as feature size and the width of the second feature are the same.

* * * * *